United States Patent [19]

Casullo

[11] Patent Number: 4,731,128

[45] Date of Patent: Mar. 15, 1988

[54] PROTECTION OF COPPER FROM CORROSION

[75] Inventor: Frank J. Casullo, Cortland, N.Y.

[73] Assignee: International Business Machines Corporation, Armonk, N.Y.

[21] Appl. No.: 52,337

[22] Filed: May 21, 1987

[51] Int. Cl.⁴ .............................................. C23U 22/52
[52] U.S. Cl. ................................. 428/470; 148/6.14 R
[58] Field of Search ........................... 148/31.5, 6.14 R

[56] References Cited

U.S. PATENT DOCUMENTS 3,531,414 9/1970 Randel ........................... 148/6.14 R Primary Examiner—Sam Silverberg
Attorney, Agent, or Firm—Pollock, Vande Sande & Priddy

[57] ABSTRACT

Copper is protected from corrosion by contacting the copper with a first azole and then contacting the copper with a second and different azole. The chemical reactivity of the first azole with copper must be greater than the reactivity of the second and different azole with copper. Also, the absorbency of the second azole on copper must be greater than the absorbency of the first azole on the copper.

13 Claims, 3 Drawing Figures

PROTECTION OF COPPER FROM CORROSION

DESCRIPTION

1. Technical Field

The present invention is concerned with a method for protecting copper-containing surfaces from corrosion. The present invention is especially used for inhibiting corrosion of copper substrates that are to be used in printed circuitry that requires storage over appreciable periods of time. The present invention is also concerned with the protected copper products obtained by the particular method of the present invention.

2. Background Art

Copper and its alloys are the most commonly used metals in electronic applications and especially in providing conductive circuit paths for printed circuit boards and printed circuit cards.

Very often it is necessary to store printed circuit boards and cards after their manufacture for substantial periods of time such as a year or more before subsequent processing such as the insertion of circuit elements and devices and soldering of these to the circuit board or card. Unfortunately, copper and copper alloys have a tendency to react with various agents present in the air such as oxygen, water vapor, carbon dioxide, chlorine, and sulfur. This, in turn, results in a decrease in the solderability of the copper-containing material over a period of time. In order to prevent corrosion of these copper-containing surfaces and to preserve its solderability, various procedures have been suggested.

For instance, it has been suggested to plate solder onto the copper-containing surface within a relatively short period of time after the bare circuit board or card has been completed. Although this method has been found effective in preserving the solderability of the circuit boards and cards, such is time-consuming, costly, and suffers from the deleterious effect of contributing to a short circuit on fine-line, high-density printed circuits.

Another common method employed is the use of immersion tin to protect the copper. However, this technique is relatively expensive and the tin is susceptible to corrosion by water vapor under relatively high humidity conditions.

In addition, there have been a number of suggestions for employing various azole materials to inhibit the corrosion of copper. For instance, U.S. Pat. Nos. 3,933,531; 4,134,959; 4,123,562; 4,373,656; 4,395,294; and 4,402,847 suggest various processes employing azoles for treating copper. However, the treatments with the azoles have not been entirely satisfactory since the extent of protection afforded has not been as good as the more expensive techniques such as the immersion tin technique.

SUMMARY OF THE INVENTION

The present invention is concerned with a method for protecting copper from corrosion. In particular, the method of the present invention includes contacting a copper-containing surface with a first azole to form a first layer on the copper-containing surface. The copper-containing surface, thus treated, is then contacted with a second and different azole. The first azole chemically reacts more readily with the copper-containing surface than does the second and different azole with the copper-containing surface. Moreover, the adsorbency of the second and different azole on the copper-containing surface must be greater than the adsorbency of the first azole.

By following the sequence of treatment with the different azoles as required by the present invention, enhanced protection against corrosion is achieved. The process of the present invention produces a retardation of corrosion that is greater than the use of either of the azoles separately. Moreover, the improved corrosion achieved by the present invention is not experienced when the sequence of treatment is the reverse of the order required by the present invention. In other words, if the copper-containing substrate is first treated with the azole having the greater adsorbency, followed by treatment with the azole having the greater chemical reactivity, the improved corrosion protection achieved by the present invention is not obtained. In addition, the process of the present invention provides for enhanced solderability of the copper-containing surface as compared to using either of the azoles separately and as compared to employing the reverse of the sequence of steps required by the present invention.

The present invention is also concerned with the improved product obtained by the above-defined process.

BEST AND VARIOUS MODES FOR CARRYING OUT INVENTION

Figure 1:
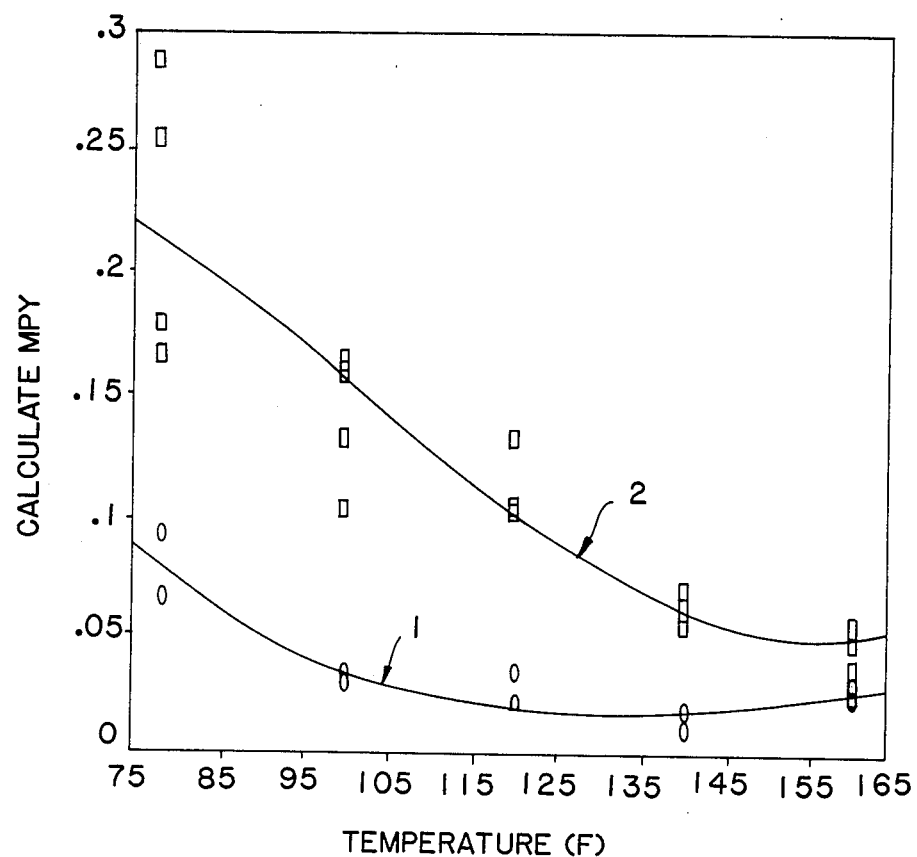
FIG. 1 is a graph illustrating the effect of the present invention on corrosion as compared to an azole treatment outside the scope of the present invention.

The surfaces protected from corrosion in accordance with the present invention are copper and copper alloy surfaces. Such are commonly employed in the fabrication of electronic components.

The azoles employed pursuant to the present invention include imidazoles, triazoles, pyrazoles, thiazoles, isothiazoles, oxaxoles, isoxazoles, amidines, and thiadiazoles. Examples of some specific azoles are imidazole; benzotriazole; indol; benzimidazole; benzamidine; 2-methylbenzimidazole; 5-methylbenzimidazole; 5,6-dimethylbenzimidazole; 2,5,6-trimethylbenzimidazole; 2-phenylbenzimidazole; mercaptobenzothiazoles; tolyltriazoles; 2-phenylimidazole; 2-benzylamidazole; 4-allyl imidazole; 4-(betahydroxy ethyl)-imidazole; purine; 4-methyl imidazole; xanthine; hypoxanthene; 2-methyl imidazole; adenine; pyrazole; 3,5-dimethyl pyrazole; 6-nitroindazole; 4-benzyl pyrazole; 4,5-dimethyl pyrazole; 3-allyl pyrazole; isothiazole; 3-mercaptoisothiazole; 3-mercaptobenzisothiazole; benzisothiazole; thiazole; 2-mercaptothiazole; 2-mercaptobenzothiazole; benzothiazole; isoxazole; 3-mercaptoisoxazole; 3-mercaptobenzisoxazole; benzisoxazole; oxazole; 2-mercaptoxazole; and 2-mercaptobenzoxazole.

The selection of a particular azole to employ in the first azole treatment step and that in the second azole treatment step will depend upon the relative chemical reactivity of the azoles selected with respect to copper, as well as the relative adsorbency of the azoles on copper.

In particular, it is essential to the success of the present invention that the first azole treatment be with an azole that is more chemically reactive with the copper than the azole of the second azole treatment, but is less adsorbent on the copper than is the azole of the second treatment.

It is further noted that the treatment of the azole compositions in accordance with the present invention can include mixtures of azoles in one or both of the azole treatment steps provided that the combined chemical reactivity and adsorbency of such mixture satisfies the above requirements of relative reactivity and adsorbency. In other words, if a mixture of azoles were employed as the first azole, then such mixture must exhibit a greater reactivity with copper than the azole or mixture of azoles employed as the second and different azole, but exhibit a lesser degree of adsorbency as does the azole(s) used as the second azole treatment.

The selection of a particular combination of an azole(s) to be used as the first azole and an azole(s) for the second and different azole treatment can be readily determined by persons skilled in the art without undue experimentation once aware of the present disclosure.

For instance, a particular sequence of azole treatment found especially effective is a treatment wherein the first azole is imidazole and the second azole is benzotriazole. Along these lines it is known that imidazole chemically reacts more readily with copper than does benzotriazole, but is less adsorbent on the copper than is the benzotriazole. For instance, see M. Baksyt, "Providing Solderability Retention by Means of Chemical Inhibitors", paper presented at Printed Circuit World Convention III, 1984.

Although not wishing to be bound by any theory, it is believed that those azoles that form aqueous solutions having a basic pH and preferably a pH of about 7.5 to about 9 chemically react more readily with the copper-containing substrate than does an azole whereby the aqueous solution thereof has an acidic pH.

According to the preferred aspects of the present invention the azoles are employed as aqueous compositions and generally contain from about 0.5 g/l to about 5 g/l of azole. Most preferably, the aqueous compositions of the first azole usually contain about 1.5 g/l to about 3 g/l. Also more preferably, the aqueous compositios of the second azole usually contain about 0.5 g/l to about 3 g/l of the azole.

The treatment with the azole compositions is usually carried out at about normal room temperature to about 100° C. and preferably at about 58° C. to about 62° C.

In addition, the treatment with the azole can be carried out from the 0.5 minute to about 10 minutes and most preferably the treatment with the first azole is from about 1.5 minutes to about 3 minutes and the treatment with the second azole is from 0.5 minute to about 5 minutes. However, the treatment can be carried out for much greater periods of time, if desired, but no special advantage is seen by doing so.

In addition, although not necessary, the copper-containing surfaces can be precleaned prior subjecting such to the treatment of the present invention. Examples of some precleaning solutions include sodium persulfate solutions, inorganic acid compositions such as hydrochloric acid, and basic pretreatments such as sodium bicarbonate and sodium carbonate. Examples of some specific precleaning solutions are aqueous solutions containing about 120 g/l of sodium persulfate with about 2% by volume of sulfuric acid; about a 25% volume by volume hydrochloric acid solution; a 35 g/l aqueous sodium carbonate solution; and about a 30 g/l aqueous sodium bircarbonate solution. The precleaning, if carried out, is usually about from 0.5 minute to about 5 minutes and preferably about 1 minute to about 2 minutes. The preferred precleaning treatment is a sequence of 1 minute with the sodium persulfate composition, followed by about 1 minute with the hydrochloric acid, and then about 2 minutes with the sodium carbonate. Such pretreatments are normally carried out at about normal room temperatures.

The folowing non-limiting examples are presented to further illustrate the present invention:

EXAMPLE 1

0.2 mil copper peel-apart foil is immersed in a precleaning solution of about 120 g/l of sodium persulfate and 2% by volume of sulfuric acid for about 1 minute, the copper is then removed from the sodium persulfate aqueous solution rinsed in deionized water for about 1 minute, and immersed in an aqueous solution of 25% volume by volume hydrochloric acid for about 1 minute. The copper is then removed from the aqueous hydrochloric acid solution, rinsed in deionized water for about 1 minute, and immersed for about 2 minutes in an aqueous sodium carbonate solution containing about 35 g/l of sodium carbonate. The copper is then removed from the aqueous sodium carbonate solution and rinsed in deionized water for about 1 minute.

After the precleaning, the copper is then immersed in an aqueous solution of imidazole containing about 2 g/l imidazole for about 2 minutes at the temperatures indicated on FIG. 1 and then contacted in an aqueous solution containing about 3 g/l of benzotriazole for about 2 minutes at the various temperatures from about ambient to about 160° F. as shown in the graph. After treatment, 1 square centimeter samples are tested for corrosion in a corroding medium of about 0.3% by weight of sodium chloride aqueous solution employing a EG & G Corrosion Test Instrument from Princeton Applied Research. The curve identified as (1) in FIG. 1 illustrates the corrosion resistance at the various temperatures employed in the pretreatment as a plot of the calculated mils of copper per year corrosion versus temperature.

COMPARISON EXAMPLE 2

Example 1 is repeated, except that the copper is not treated with the imidazole aqueous solution, but is treated with the aqueous benzotriazole solution. The results achieved are illustrated as Curve 2 in FIG. 1.

As clear, from a comparison of Curves 1 and 2 in FIG. 1, the sequence of azole treatment pursuant to the present invention provides for significantly reduced corrosion of the copper.

In addition, the treatment in accordance with Example 1 demonstrates significantly better meniscograph solderability after "steam-aging" for 24, 32, and 40 hours as compared to the treatment with the benzotriazole without the imidazole.

For example, the treatment with the benzotriazole without the imidazole shows massive dewetting of solder using a rosin mildly activated flux when exposed to the above conditions of "steam-aging"; whereas, the treatment of the present invention as in Example 1 demonstrates no such dewetting.

Moreover, additional testing of "steam-aging" at 4, 8, 12, 16, and 20 hours demonstrates that the treatment with benzotriazole alone exhibited dewetting the solder beginning at about 8 hours; whereas, the treatment in accordance with the present invention exhibits good wetting even up to 40 hours.

COMPARISON EXAMPLE 3

Example 1 is repeated, except that the treatment with the benzotriazole is prior to the treatment with the imidazole.

Figure 2:
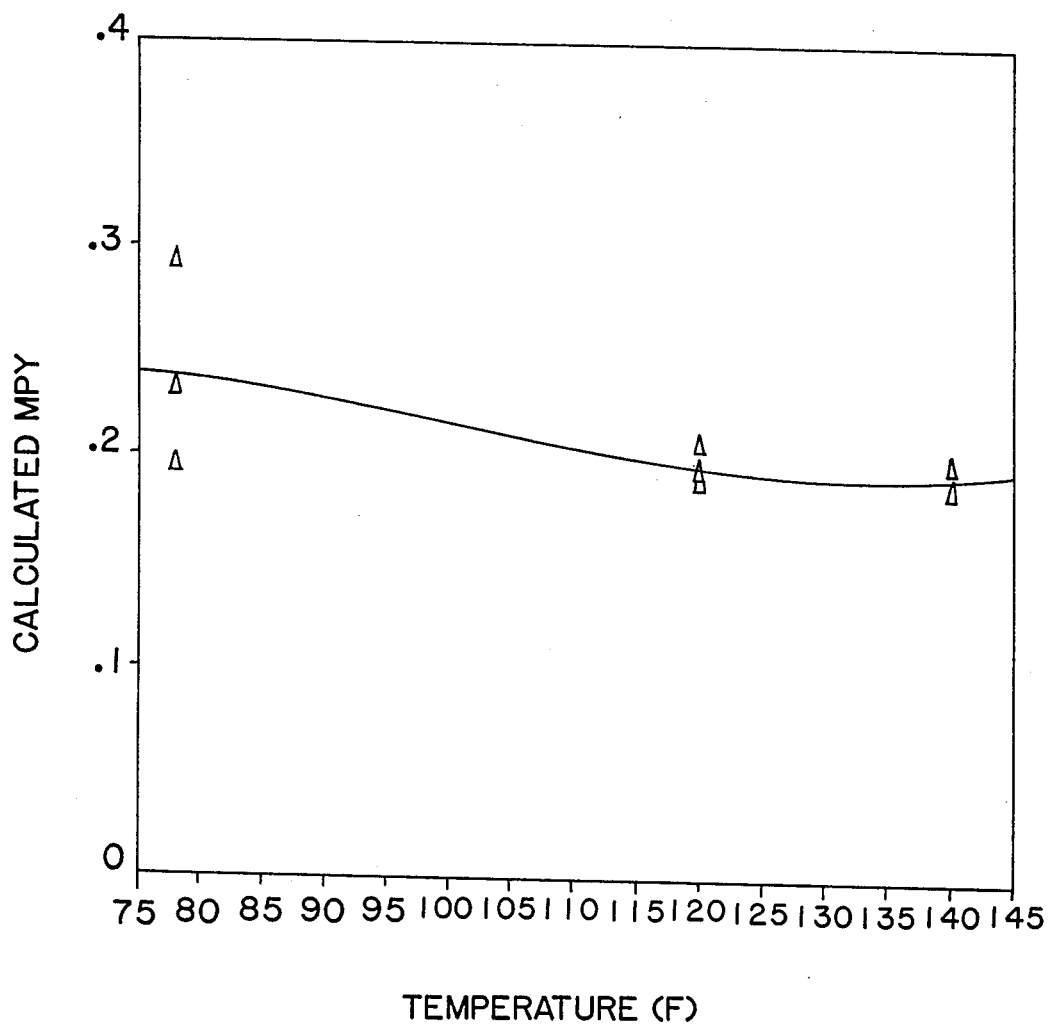
FIGS. 2 and 3 are graphs illustrating the effect on corrosion of azole treatments outside the scope of the present invention.

FIG. 2 illustrates the corrosion results obtained by the reverse treatment as compared to that required by the present invention.

As noted from FIG. 2 and a comparison of the curve therein with the results shown in Curve 1 of FIG. 1, the reverse of the treatment pursuant to the present invention does not provide the same degree of corrosion protection as achieved by the present invention.

COMPARISON EXAMPLE 4

Figure 3:
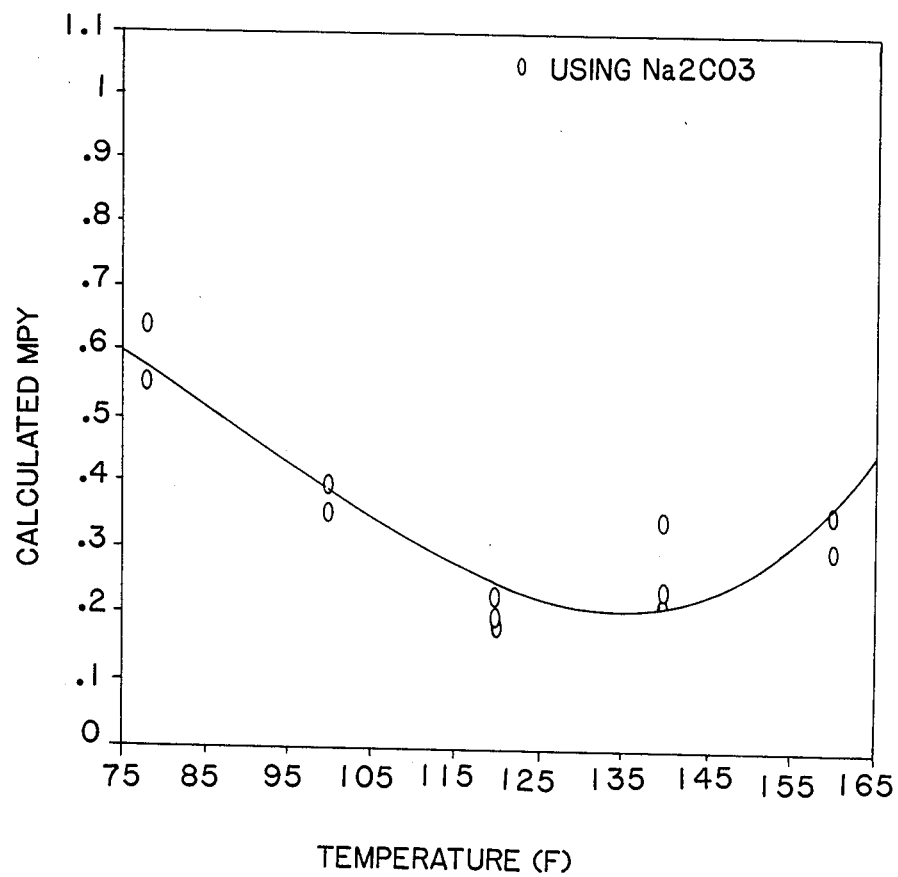

Example 1 is repeated, except that the copper is not treated with the aqueous benzotriazole solution, but is treated with the imidazole solution. The results achieved are illustrated in FIG. 3. As noted from FIG. 3 and a comparison of the above therein with the results shown in Curve 1 of FIG. 1, the use of imidazole alone does not provide the same degree of corrosion protection as achieved by the present invention.

In addition, the thickness of the coating material in Example 1 is about 240 angstroms as compared to only about 60 angstroms when the benzotriazole or the imidazole are employed separately.

Having thus described my invention, what I claim as new and desire to secure by Letters Patent is:

1. A method for protecting copper from corrosion which comprises:
    (a) contacting a copper-containing surface with a first azole to form a first layer thereon; and
    (b) contacting the copper from step (a) with a second and different azole;
wherein the first azole chemically reacts more readily with copper than does the second and different azole with copper; and wherein the adsorbency of the second and different azole on copper is greater than the adsorbency of the first azole.

2. The method of claim 1 wherein aqueous compositions of the first and second azoles are employed.

3. The method of claim 1 wherein the first azole is employed as an aqueous solution containing about 0.5 g/l to about 5 g/l of the first azole and wherein the second azole is employed as an aqueous solution containing about 0.5 g/l to about 5 g/l of the second azole.

4. The method of claim 1 wherein the first azole is employed as an aqueous solution containing about 1.5 g/l to about 3 g/l of azole and the second azole is employed as an aqueous solution containing about 0.5 g/l to about 3 g/l of azole.

5. The method of claim 1 wherein the contracting with the first azole is from about 0.5 minute to about 10 minutes and the contacting with the second azole is from about 0.5 minute to about 10 minutes.

6. The method of claim 1 wherein the contacting with the first azole is from about 1.5 minutes to about 3 minutes and the contacting with the second azole is from about 0.5 minute to about 5 minutes.

7. The method of claim 1 wherein the treatment with the first azole and the second azole is carried out at temperatures from about normal ambient temperatures to about 100° C.

8. The method of claim 1 wherein the contacting with the first azole and the second azole is carried out at about 58° C. to about 62° C.

9. The method of claim 1 wherein said first azole exhibits a basic pH and said second and different azole exhibits an acidic pH.

10. The method of claim 1 wherein said first azole is imidazole and said second azole is benzotriazole.

11. The method of claim 1 which further includes precleaning the copper prior to contacting with the first azole.

12. The method of claim 11 wherein said pretreating comprises contacting with an aqueous sodium persulfate solution followed by an aqueous hydrochloric acid solution, followed by an aqueous sodium carbonate solution.

13. A product obtained by the method of claim 1.

* * * * *